(12) United States Patent
Cho et al.

(10) Patent No.: US 11,889,274 B2
(45) Date of Patent: Jan. 30, 2024

(54) ELECTRONIC DEVICE FOR SENSING TEMPERATURE OF SPEAKER, AND OPERATION METHOD THEREOF

(71) Applicant: Samsung Electronics Co., Ltd., Gyeonggi-do (KR)

(72) Inventors: Joonrae Cho, Gyeonggi-do (KR); Wonwook Lee, Gyeonggi-do (KR); Hochul Hwang, Gyeonggi-do (KR); Hyunjong Roh, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 827 days.

(21) Appl. No.: 16/967,191

(22) PCT Filed: Mar. 6, 2019

(86) PCT No.: PCT/KR2019/002571
§ 371 (c)(1),
(2) Date: Aug. 4, 2020

(87) PCT Pub. No.: WO2019/172633
PCT Pub. Date: Sep. 12, 2019

(65) Prior Publication Data
US 2021/0051429 A1 Feb. 18, 2021

(30) Foreign Application Priority Data
Mar. 6, 2018 (KR) .................. 10-2018-0026476

(51) Int. Cl.
*H04R 29/00* (2006.01)
*G01K 1/14* (2021.01)
(Continued)

(52) U.S. Cl.
CPC ............. *H04R 29/001* (2013.01); *G01K 1/14* (2013.01); *G01K 3/005* (2013.01); *G01K 7/22* (2013.01); *G01R 22/00* (2013.01); *H04R 3/00* (2013.01)

(58) Field of Classification Search
CPC .......... G01R 22/00; H04R 3/002; H04R 3/00; H04R 3/007; H04R 29/001; G01K 7/22;
(Continued)

(56) References Cited

U.S. PATENT DOCUMENTS

2009/0028349 A1    1/2009   Park
2009/0097689 A1    4/2009   Prest et al.
(Continued)

FOREIGN PATENT DOCUMENTS

| CN | 111492138 B | * | 2/2023 | .............. H02P 29/68 |
|----|---|---|---|---|
| KR | 10-2009-0011236 A | | 2/2009 | |
| KR | 10-2015-0084136 A | | 7/2015 | |

OTHER PUBLICATIONS

Notice of Preliminary Rejection dated Jun. 27, 2022.
Notice of Patent Grant dated Oct. 13, 2022.

*Primary Examiner* — Md S Elahee
(74) *Attorney, Agent, or Firm* — Cha & Reiter, LLC

(57) ABSTRACT

An electronic device according to various embodiments, may include a speaker, a temperature sensor disposed in at least some area inside the speaker, and at least one processor configured to obtain a first temperature of the at least some area using the temperature sensor, obtain a second temperature based on measuring impedance of a voice coil included in the speaker, determine a temperature of the speaker based on at least one of the first temperature and the second temperature, and change a function of the electronic device based at least on the determined temperature of the speaker.

13 Claims, 12 Drawing Sheets

(51) Int. Cl.
 *G01K 3/00* (2006.01)
 *G01K 7/22* (2006.01)
 *G01R 22/00* (2006.01)
 *H04R 3/00* (2006.01)

(58) Field of Classification Search
 CPC ...... G01K 3/005; G01K 1/14; G01K 2217/00; H02P 29/68; G06F 1/3206
 USPC ...................................................... 381/59, 5
 See application file for complete search history.

(56) References Cited

U.S. PATENT DOCUMENTS

| | | |
|---|---|---|
| 2011/0140899 A1 | 6/2011 | Flandin |
| 2015/0200638 A1 | 7/2015 | Ko et al. |
| 2017/0094408 A1 | 3/2017 | Napoli et al. |
| 2017/0127205 A1 | 5/2017 | Lin |
| 2017/0168543 A1* | 6/2017 | Dai ....................... G06F 1/3206 |
| 2017/0366899 A1 | 12/2017 | Mendes et al. |
| 2019/0305741 A1* | 10/2019 | Yoneda .................. H04R 3/007 |

\* cited by examiner

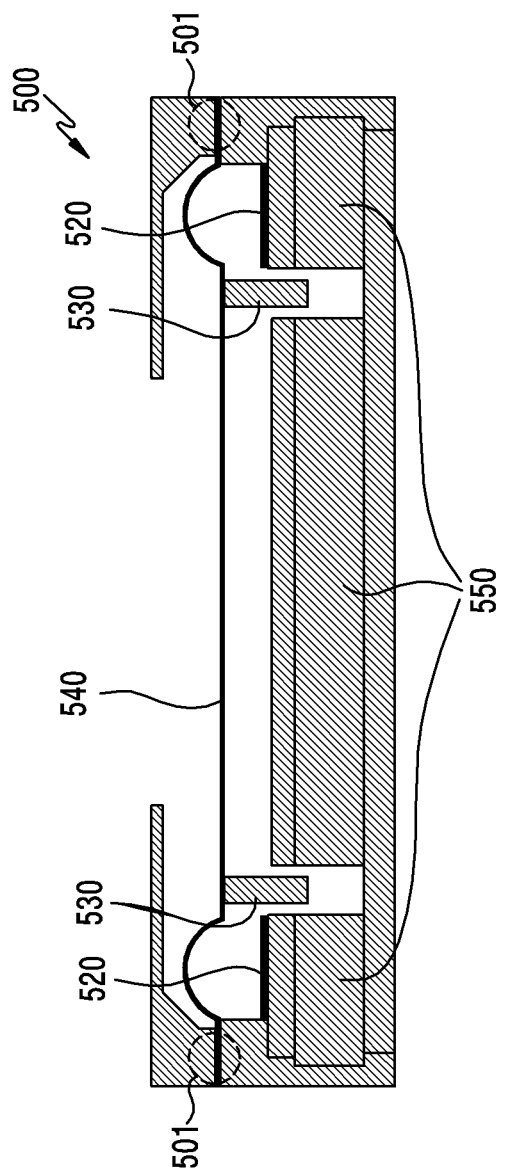

ELECTRONIC DEVICE FOR SENSING TEMPERATURE OF SPEAKER, AND OPERATION METHOD THEREOF

CROSS REFERENCE TO RELATED APPLICATIONS

This application is a National Phase Entry of PCT International Application No. PCT/KR2019/002571, which was filed on Mar. 6, 2019, and claims a priority to Korean Patent Application No. 10-2018-0026476, which was filed on Mar. 6, 2018, the contents of which are incorporated herein by reference.

TECHNICAL FIELD

Various embodiments relate to a method and an electronic device for sensing a temperature of a speaker.

BACKGROUND ART

With development of digital technology, various electronic devices such as a mobile communication terminal, a personal digital assistant (PDA), an electronic notebook, a smart phone, a tablet personal computers (PC), or a wearable device, and artificial intelligence (AI) speaker, are supplied. Various electronic devices may include a speaker, and may provide various audio information to a user by use of the speaker. For example, various electronic devices may play music or multimedia content through the speaker.

DISCLOSURE OF INVENTION

Technical Problem

If a temperature of a speaker rises, a part included in the speaker is deformed, and thus a quality of the speaker may be degraded or the part included in the speaker may be damaged. Hence, for protection of the speaker, the speaker may be designed to cut power if it is higher than a specific temperature. However, due to difficulty in directly measuring the temperature of the speaker or the internal component of the speaker, a range of the temperature guaranteeing the quality of the speaker may be set narrowly. Thus, to widen the range of the temperature guaranteeing the quality of the speaker as much as possible, a method for measuring the accurate temperature of the speaker may be required.

Various embodiments may provide an electronic device and a method for accurately measuring the temperature of the speaker using a temperature sensor, and reducing the temperature of the speaker.

The technical problem to achieve in the present document is not limited to the technical problem mentioned above, and other technical problems not mentioned above may be clearly understood by those skilled in the technical field to which the present invention belongs from the following descriptions.

Solution to Problem

An electronic device according to various embodiments, may include a speaker, a temperature sensor disposed in at least some area inside the speaker, and at least one processor configured to obtain a first temperature of the at least some area using the temperature sensor, obtain a second temperature based on measuring impedance of a voice coil included in the speaker, determine a temperature of the speaker based on at least one of the first temperature and the second temperature, and change a function of the electronic device based at least on the determined temperature of the speaker.

A method of an electronic device according to various embodiments, may include obtaining a first temperature of the at least some area using a temperature sensor disposed in at least some area inside a speaker of the electronic device, obtaining a second temperature based on measuring impedance of a voice coil included in the speaker, determining a temperature of the speaker based on at least one of the first temperature and the second temperature, and changing a function of the electronic device based at least on the determined temperature of the speaker.

Advantageous Effects of Invention

An apparatus and a method according to various embodiments, may widen a range of a temperature guaranteeing a quality of a speaker as much as possible, by accurately measuring the temperature of the speaker using a temperature sensor.

An apparatus and a method according to various embodiments, may protect a speaker by reducing a temperature of the speaker.

Effects obtainable from the present disclosure are not limited to the above-mentioned effects, and other effects which are not mentioned may be clearly understood by those skilled in the technical field to which the present disclosure belongs from the following descriptions.

BRIEF DESCRIPTION OF DRAWINGS

FIG. 5 is a cross-sectional view of a speaker according to some other embodiments.

BEST MODE FOR CARRYING OUT THE INVENTION

Figure 1:
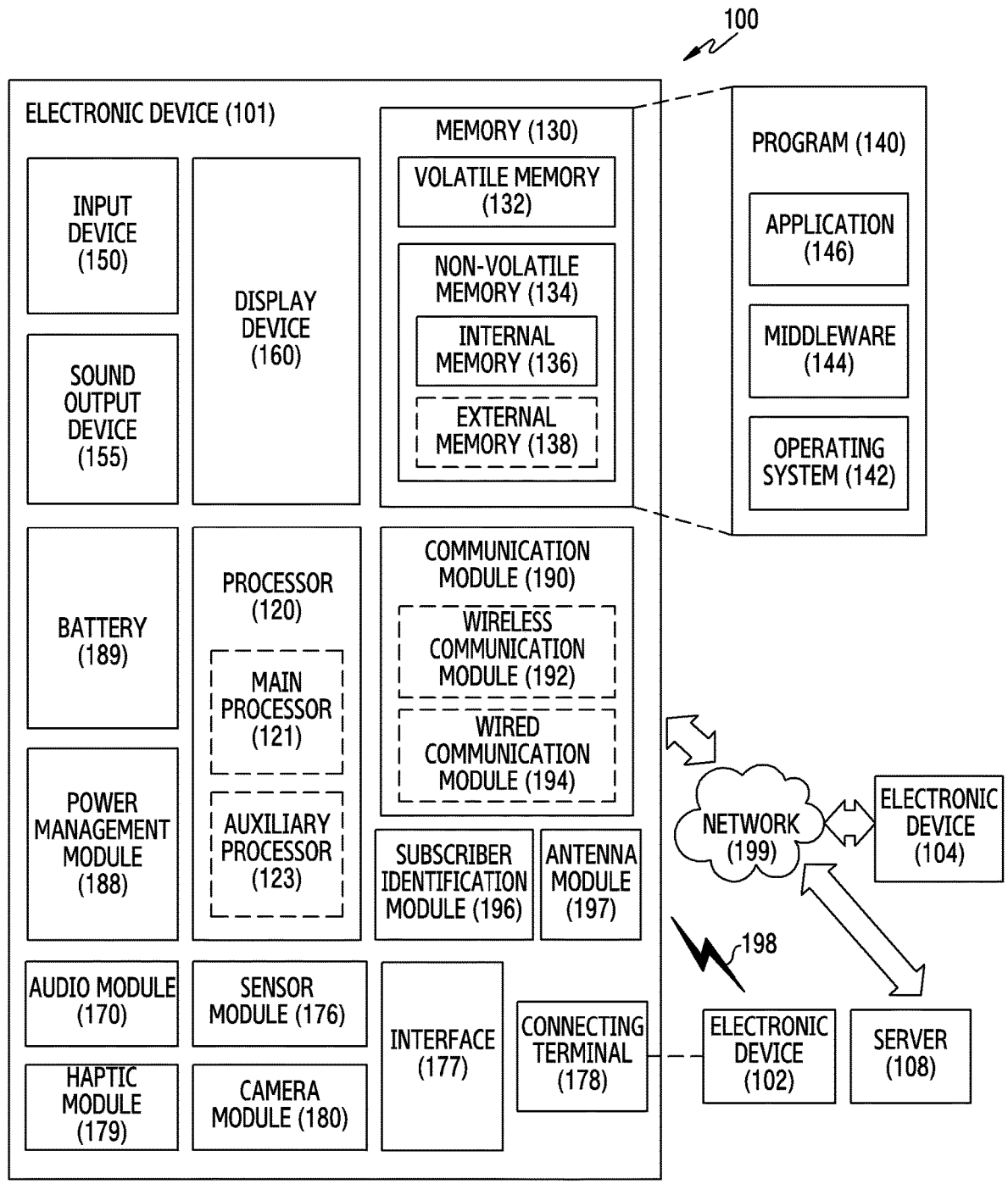
FIG. 1 is a block diagram of an electronic device in a network environment, according to various embodiments.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wired) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wired) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS)

communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
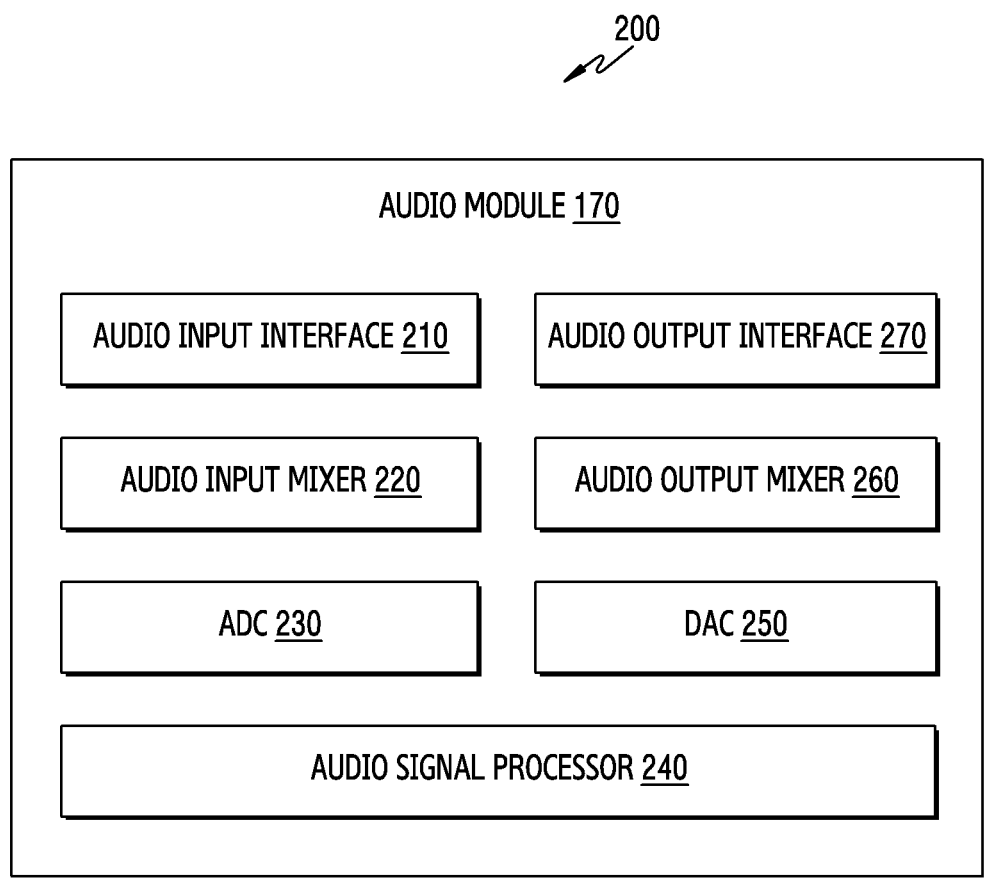
FIG. 2 is a block diagram of an audio module, according to various embodiments.

FIG. 2 is a block diagram 200 illustrating the audio module 170 according to an embodiment of the disclosure.

Referring to FIG. 2, the audio module 170 may include, for example, an audio input interface 210, an audio input mixer 220, an analog-to-digital converter (ADC) 230, an audio signal processor 240, a digital-to-analog converter (DAC) 250, an audio output mixer 260, or an audio output interface 270.

The audio input interface 210 may receive an audio signal corresponding to a sound obtained from the outside of the electronic device 101 via a microphone (e.g., a dynamic microphone, a condenser microphone, or a piezo microphone) that is configured as part of the input device 150 or separately from the electronic device 101. For example, if an audio signal is obtained from the external electronic device 102 (e.g., a headset or a microphone), the audio input interface 210 may be connected with the external electronic device 102 directly via the connecting terminal 178, or wirelessly (e.g., Bluetooth™ communication) via the wireless communication module 192 to receive the audio signal. According to an embodiment, the audio input interface 210 may receive a control signal (e.g., a volume adjustment signal received via an input button) related to the audio signal obtained from the external electronic device 102. The audio input interface 210 may include a plurality of audio input channels and may receive a different audio signal via a corresponding one of the plurality of audio input channels, respectively. According to an embodiment, additionally or alternatively, the audio input interface 210 may receive an audio signal from another component (e.g., the processor 120 or the memory 130) of the electronic device 101.

The audio input mixer 220 may synthesize a plurality of inputted audio signals into at least one audio signal. For example, according to an embodiment, the audio input mixer 220 may synthesize a plurality of analog audio signals inputted via the audio input interface 210 into at least one analog audio signal.

The ADC 230 may convert an analog audio signal into a digital audio signal. For example, according to an embodiment, the ADC 230 may convert an analog audio signal received via the audio input interface 210 or, additionally or alternatively, an analog audio signal synthesized via the audio input mixer 220 into a digital audio signal.

The audio signal processor 240 may perform various processing on a digital audio signal received via the ADC 230 or a digital audio signal received from another component of the electronic device 101. For example, according to an embodiment, the audio signal processor 240 may perform changing a sampling rate, applying one or more filters, interpolation processing, amplifying or attenuating a whole or partial frequency bandwidth, noise processing (e.g., attenuating noise or echoes), changing channels (e.g., switching between mono and stereo), mixing, or extracting a specified signal for one or more digital audio signals. According to an embodiment, one or more functions of the audio signal processor 240 may be implemented in the form of an equalizer.

The DAC 250 may convert a digital audio signal into an analog audio signal. For example, according to an embodiment, the DAC 250 may convert a digital audio signal processed by the audio signal processor 240 or a digital audio signal obtained from another component (e.g., the processor (120) or the memory (130)) of the electronic device 101 into an analog audio signal.

The audio output mixer 260 may synthesize a plurality of audio signals, which are to be outputted, into at least one audio signal. For example, according to an embodiment, the audio output mixer 260 may synthesize an analog audio signal converted by the DAC 250 and another analog audio signal (e.g., an analog audio signal received via the audio input interface 210) into at least one analog audio signal.

The audio output interface 270 may output an analog audio signal converted by the DAC 250 or, additionally or alternatively, an analog audio signal synthesized by the audio output mixer 260 to the outside of the electronic device 101 via the sound output device 155. The sound output device 155 may include, for example, a speaker, such as a dynamic driver or a balanced armature driver, or a receiver. According to an embodiment, the sound output device 155 may include a plurality of speakers. In such a case, the audio output interface 270 may output audio signals having a plurality of different channels (e.g., stereo channels or 5.1 channels) via at least some of the plurality of speakers. According to an embodiment, the audio output interface 270 may be connected with the external electronic device 102 (e.g., an external speaker or a headset) directly via the connecting terminal 178 or wirelessly via the wireless communication module 192 to output an audio signal.

According to an embodiment, the audio module 170 may generate, without separately including the audio input mixer 220 or the audio output mixer 260, at least one digital audio signal by synthesizing a plurality of digital audio signals using at least one function of the audio signal processor 240.

According to an embodiment, the audio module 170 may include an audio amplifier (not shown) (e.g., a speaker amplifying circuit) that is capable of amplifying an analog audio signal inputted via the audio input interface 210 or an audio signal that is to be outputted via the audio output interface 270. According to an embodiment, the audio amplifier may be configured as a module separate from the audio module 170.

Figure 3:
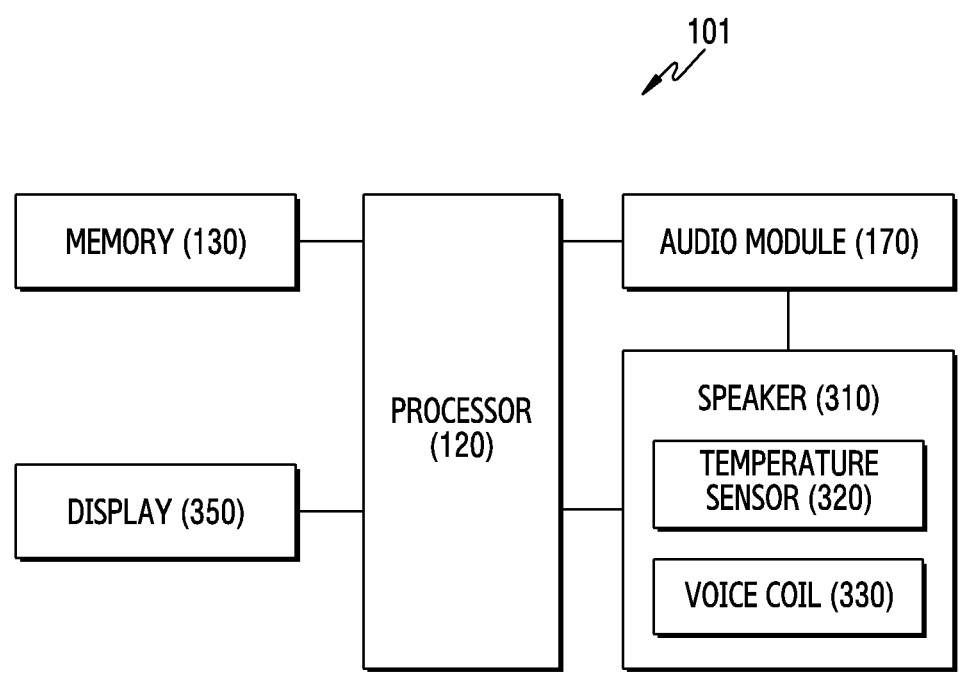
FIG. 3 illustrates an example of a functional configuration of an electronic device according to various embodiments.

FIG. 3 illustrates an example of a functional configuration of an electronic device according to various embodiments. The electronic device illustrated in FIG. 3, may correspond to the electronic device 101 of FIG. 1. The electronic device 101 according to various embodiments, may include a smartphone, a tablet PC, a wearable device, a home appliance, a speaker, an artificial intelligence (AI) speaker, and the like.

Referring to FIG. 3, the electronic device 101 may include a speaker 310, an audio module 170, a processor 120, a display 350, and a memory 130. The speaker 310, may include a temperature sensor 320 and a voice coil 330. However, it is not limited thereto, and some component may be omitted or other component may be added to the electronic device 101. For example, if the electronic device 101 is a speaker or an AI speaker, the display 350 may be omitted.

The speaker 310 may correspond to the sound output device 155 of FIG. 1, and the display 350 may correspond to the display device 160 of FIG. 1.

The speaker 310 may output sound, by converting an electrical signal received from the processor 120 or the audio module 170 to sound waves. For example, the speaker 310 may receive an electrical signal (e.g., a pulse) related to audio information from the processor 120 through the audio module 170. The speaker 310 may receive an electric signal (e.g., a pulse) amplified by an amplifier included in the audio module 170 or configured as a separate module from the audio module 170. The electrical signal may include audio information for the output through the speaker 310.

The speaker 310 may convert the received electrical signal to vibrations of a diaphragm. For example, based on the received electrical signal, the speaker 310 may apply current to the voice coil 330 included in the speaker 310. The voice coil 330 may be located in a magnetic field of a magnet (e.g., a permanent magnet), and may receive a force (e.g., a magnetic force), according to the intensity of the current flowing through the voice coil 330. According to the force received at the voice coil 330, the diaphragm included in the speaker 310 may vibrate. The vibrations of the diaphragm may radiate sound waves, by generating compression waves in the air. As the diaphragm vibrates due to the force received by the voice coil 330, the speaker 310 may output sound.

The voice coil 330 may generate heat as the speaker 310 outputs the sound. As the heat is generated, impedance of the voice coil 330 may change. For example, as the temperature increases, the impedance of the voice coil 330 may increase. The impedance of the voice coil 330 may be used to predict (or determine) the temperature of the speaker 310. The impedance of the voice coil 330 may be measured by the processor 120 or the audio module 170, to predict (or determine) the temperature of the speaker 310.

The speaker 310 may include a temperature sensor 320. The temperature sensor 320 may detect (or obtain) a temperature of a location (or a surrounding) at which the temperature sensor 320 is disposed. For example, the temperature sensor 320 may include a thermistor. The thermistor may vary in resistance according to the temperature. For example, as the temperature increase, the resistance of the thermistor may increase. However, it is not limited thereto. The temperature of the speaker 310 measured by the temperature sensor 320 may be more accurate than the temperature of the speaker 310 measured using the impedance of the voice coil 330.

The temperature sensor 320 may be disposed (or attached) to at least some area inside the speaker 310. In some embodiments, the temperature sensor 320 may be disposed near a heating source (e.g., the voice coil 330) inside the speaker 310. In some other embodiments, the temperature sensor 320 may be disposed near a heat sensitive material or component inside the speaker 310. The heat sensitive material or component inside the speaker 310 may be determined at a manufacturing stage of the electronic device 101 through, for example, an experiment. The heat sensitive material or component inside the speaker 310 may vary according to the type of the electronic device 101 or the type of the speaker 310.

If the temperature of the speaker 310 is obtained using the temperature sensor 320 disposed near the heat sensitive portion inside the speaker 310, a more accurate temperature of the heat sensitive portion may be obtained, than obtaining the temperature of the speaker 310 using the impedance of the voice coil 330. Thus, a range of the temperature for guaranteeing the quality of the speaker 310 may be further widened.

The audio module 170 may bidirectionally convert a sound and an electrical signal. For example, the audio module 170 may receive a digital audio signal for the output through the speaker 310, from the processor 120. The audio module 170 may convert the received digital audio signal to an analog audio signal, through the DAC 250. The analog audio signal may be an electrical signal. The audio module 170 may amplify the electrical signal through an amplifier included in the audio module 170, or transmit the electrical signal to an amplifier configured as a separate module from the audio module 170 to amplify it.

The audio module 170 may perform at least part of the operation of determining the temperature of the speaker 310. For example, to determine the temperature of the speaker 310, the audio module 170 may obtain various measurement values such as impedance, voltage, or current of an internal component of the speaker 310 from the speaker 310.

In various embodiments, the audio module 170 may obtain a measurement value from the temperature sensor 320 included in the speaker 310. For example, if the temperature sensor 320 is a thermistor, the audio module 170 may obtain a voltage of both ends of the thermistor. The audio module 170 may obtain a temperature around the thermistor based on the voltage of the thermistor ends and a table stored in the memory 130. Alternatively, the audio module 170 may obtain a value indicating the temperature measured by the temperature sensor 320 (e.g., the thermistor). However, it is not limited thereto. Hereinafter, a first temperature may indicate the temperature obtained using the temperature sensor 320 (e.g., the thermistor).

In various embodiments, the audio module 170 may obtain a measurement value related to the impedance of the voice coil 330 included in the speaker 310. For example, the audio module 170 may perform at least one of obtaining the voltage and/or the current of the voice coil 330, identifying the impedance of the voice coil 330 based on the voltage and/or the current of the voice coil 330, and acquiring the temperature based on the impedance of the voice coil 330 and the table stored in the memory 130. For example, the audio module 170 may obtain the temperature based on the table by receiving the impedance value measured by the speaker 310. Hereinafter, a second temperature may indicate the temperature obtained based on the impedance of the voice coil 330. The second temperature may be a predicted temperature rather than the accurate temperature of the speaker 310.

The audio module 170 may determine the temperature of the speaker 310 based on at least one of the first temperature obtained using the temperature sensor 320 and the second temperature obtained based on the impedance of the voice coil 330. Alternatively, the audio module 170 may transmit data relating to the first temperature and data relating to the second temperature to the processor 120, so that the processor 120 determines the temperature of the speaker 310 based on at least one of the first temperature and the second temperature. By determining the temperature of the speaker 310 based on at least one of the first temperature and the second temperature, the accurate temperature of the speaker 310 may be acquired. In addition, by changing a weight of the first temperature and a weight of the second temperature for determining the temperature of the speaker 310 according to an operation state of the electronic device 101, the temperature determination of the speaker 310 according to the operation state of the electronic device may be optimized.

The audio module 170 may change a function of the electronic device 101 or the speaker 310, based on the temperature of the speaker 310 determined based on at least one of the first temperature and the second temperature. For example, if the determined temperature of the speaker 310 is greater than or equal to a designated temperature, the audio module 170 may set an equalizer (e.g., the audio signal processor 240) to a low power mode while outputting the sound through the speaker 310.

At least some function of the audio module 170 may be performed by the processor 120.

The processor 120 may control overall operations of the electronic device 101. The processor 120 may receive commands of other components (e.g., the speaker 310, the audio module 170, the display 350, and the memory 130, etc.), interpret the received commands, and perform calculation or process data according to the interpreted command. The processor 120 may be implemented in software, may be implemented in hardware such as a chip, a circuit, or the like, or may be implemented in combination of software and hardware. The processor 120 may be one or a combination of a plurality of processors.

In various embodiments, the processor 120 may receive a value related to the first temperature from the audio module 170 or the speaker 310. For example, the processor 120 may receive data indicating the first temperature obtained from the temperature sensor 320, or may receive data indicating the first temperature from the audio module 170. In another example, the processor 120 may receive a value indicating the resistance or the voltage inside the temperature sensor 320 (e.g., the thermistor), and identify the first temperature around the temperature sensor 320 based on the table received and stored in the memory 130.

In various embodiments, the processor 120 may receive a value related to the second temperature from the audio module 170 or the speaker 310. For example, the processor 120 may receive data indicating the second temperature based on the impedance of the voice coil 330 from the speaker 310, or may receive data indicating the second temperature from the audio module 170. In another example, the processor 120 may obtain the voltage and/or the current of the voice coil 330, identify the impedance of the voice coil 330 based on the voltage and/or the current of the voice coil 330, and obtain the second temperature based on the impedance of the voice coil 330 and the table stored in the memory 130.

The processor 120 may determine the temperature of the speaker 310 based on at least one of the first temperature and the second temperature. If determining the temperature of the speaker 310 based on only the impedance measurement of the voice coil 330 (i.e., if determining the second temperature as the temperature of the speaker 310), the accuracy of the temperature measurement of the speaker 310 may be degraded. This is because the measurement value of the impedance of the voice coil 330 may change even if the temperature does not change, due to a change in a contact point of the circuit. Hence, the processor 120 may determine an optimal temperature of the speaker 310 based on at least one of the first temperature and the second temperature.

The processor 120 may identify the operation state of the electronic device 101, and identify the weight of the first temperature and the weight of the second temperature for determining the temperature of the speaker 310 according to the operation state of the electronic device 101.

For example, if the electronic device 101 is in a designated operation state having considerable heat generation (e.g., using multimedia), the processor 120 may obtain the accurate temperature of the speaker 310 by increasing the weight of the first temperature and lowering the weight of the second temperature for determining the temperature of the speaker 310. For example, in a designated operation state (e.g., a handset mode) having less heat generation of the electronic device 101, the processor 120 may lower the current consumption of the speaker 310, by decreasing the weight of the first temperature and increasing the weight of the second temperature for determining the temperature of the speaker 310. The weight of the first temperature and the weight of the second temperature for determining the temperature of the speaker 310 per electronic device 101 or operation state of the electronic device 101 may be stored in the memory 130.

The processor 120 may determine the temperature of the speaker 310 based on the identified weight. For example, if the weight of the first temperature and the weight of the second temperature identified are 8:2, the processor 120 may determine the temperature of the speaker 310 by applying the first temperature and the second temperature as 8:2.

The processor 120 may change a function of the electronic device 101 or the speaker 310 based on the determined temperature of the speaker 310. The processor 120 may limit the function of the electronic device 101 to lower the temperature of the speaker 310, based on identifying that the temperature of the speaker 310 is greater than or equal to a designated temperature. For example, based on identifying that the temperature of the speaker 310 is greater than or equal to the designated temperature, the processor 120 may set the equalizer (e.g., the audio signal processor 240) to the low power mode, or lower brightness of the display 350, set the processor 120 to the low power mode, or display a notification guiding to terminate an unused application. As another example, the processor 120 may output different media art through the display 350 according to the temperature of the speaker 310.

The display 350 may display a screen of the electronic device 101. The display 350 may display various types of information. The display 350 may display a user interface related to a music play application. The display 350 may display media art related to the music play.

The memory 130 may indicate one or more memory sets. The memory 130 may execute instructions stored in the memory 130 based on signaling with the processor 120. The memory 130 may store data and/or commands received from other components (e.g., the processor 120, the speaker 310, the audio module 170, or the display 350) or generated by other components. In various embodiments, the memory 130 may store a table for identifying the first temperature from the measurement value (e.g., the resistance or the voltage) of the temperature sensor 320. The memory 130 may store a table for identifying the second temperature from the measurement value (e.g., the impedance, the current, or the voltage) related to the impedance of the voice coil 330. The memory 130 may store the weight of the first temperature and the weight of the second temperature for determining the temperature of the speaker 310 for each operation state of the electronic device 101 (e.g., a multimedia use mode or a handset mode). For example, the weight of the first temperature and the weight of the second temperature for determining the temperature of the speaker 310 according to the operation state of the electronic device 101 may be determined at the manufacturing phase of the electronic device 101. For example, the weight of the first temperature and the weight of the second temperature may be obtained through an experiment, to determine the optimal temperature of the speaker 310.

Figure 4A:
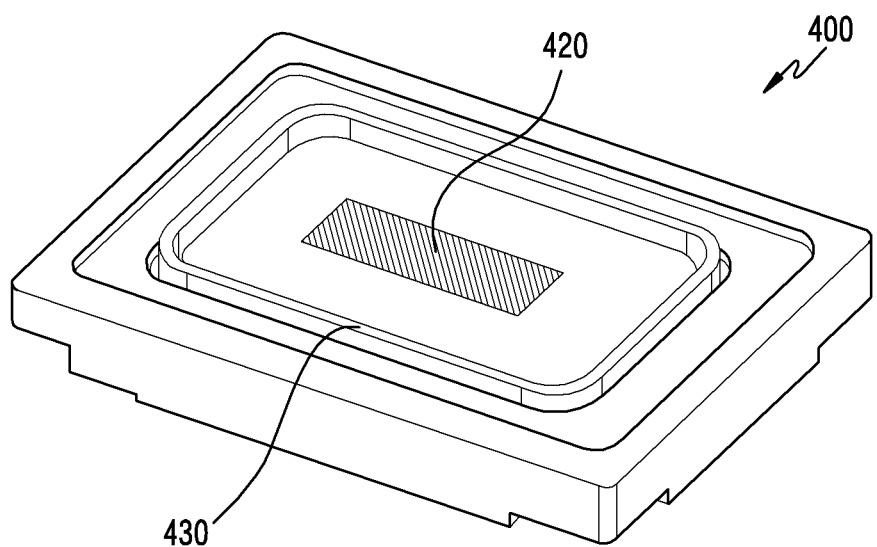
FIG. 4A is a perspective view of a speaker according some embodiments.
Figure 4B:
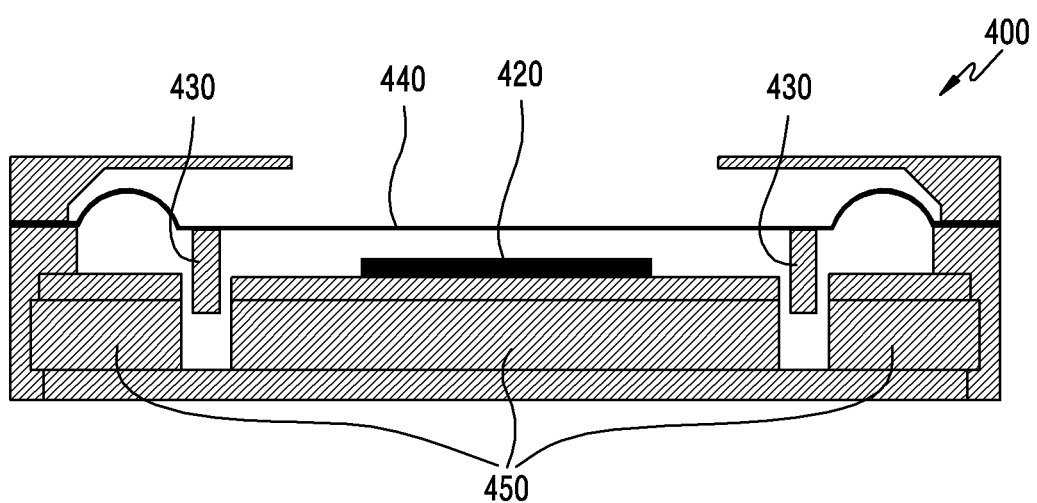
FIG. 4B is a cross-sectional view of the speaker according some embodiments.

FIG. 4A is a perspective view of a speaker according some embodiments. FIG. 4B is a cross-sectional view of the speaker according some embodiments. The speaker 400 illustrated in FIG. 4A and FIG. 4B may correspond to the speaker 310 of FIG. 3. The speaker 400 may be mounted on the electronic device 101.

Referring to FIG. 4A and FIG. 4B, the speaker 400 may include a temperature sensor 420, a voice coil 430, a diaphragm 440, and a magnet 450. The temperature sensor 420 may correspond to the temperature sensor 320 of FIG. 3, and the voice coil 430 may correspond to the voice coil 330 of FIG. 3.

The speaker 400 may receive an electrical signal (e.g., a pulse) relating to audio information through an audio module (e.g., the audio module 170). The speaker 400 may apply current to the voice coil 430, based on the received electrical signal. The voice coil 430 may be disposed in a magnetic field of the magnet 450 (e.g., a permanent magnet), and may receive a force (e.g., a magnetic force), according to the intensity of the current flowing through the voice coil 430. According to the force received at the voice coil 430, the diaphragm 440 may vibrate. The vibration of the diaphragm 440 generates compression waves in the air, and thus the speaker 400 may output sound.

The temperature sensor 420 may be disposed near a heating source (e.g., the voice coil 430). For example, in the speaker 400, the temperature sensor 420 may be disposed at the center of the heating source (e.g., the voice coil 430). By arranging the temperature sensor 420 at the center of the heating source, the electronic device 101 may directly detect a temperature of an area where the heat of the speaker 400 is gathered most. If the temperature sensor 420 is disposed at the center of the heating source, the temperature of the speaker 400 may be measured more accurately than arranging the temperature sensor 420 away from the heating source. If the temperature sensor 420 is disposed at the center of the heating source, the temperature guaranteeing the quality of the speaker 400 may be determined based on the temperature obtained by the temperature sensor 420 disposed at the center of the heating source.

By determining the temperature of the speaker 400 using the temperature sensor 420 as well as the impedance measurement of the voice coil 430, the accurate temperature of the speaker 400 may be measured.

FIG. 5 is a cross-sectional view of a speaker according to some other embodiments. A speaker 500 illustrated in FIG. 5 may correspond to the speaker 310 of FIG. 3. The speaker 500 may be mounted on the electronic device 101.

Referring to FIG. 5, the speaker 500 may include a temperature sensor 520, a voice coil 530, a diaphragm 540, and a magnet 550. The temperature sensor 520 may correspond to the temperature sensor 320 of FIG. 3, and the voice coil 530 may correspond to the voice coil 330 of FIG. 3.

The speaker 500 may apply current to the voice coil 530, based on an electrical signal received from an audio module (e.g., the audio module 170). The voice coil 530 may receive a force (e.g., a magnetic force) by a magnetic field of the magnet 550 (e.g., a permanent magnet), according to the intensity of the current flowing through the voice coil 530. The diaphragm 540 vibrates according to the force received at the voice coil 530, and thus the speaker 400 may output sound.

The temperature sensor 520 may be disposed near a heat sensitive material (e.g., an adhesive member) or component. The heat sensitive material or component inside the speaker 310 may be determined at the manufacturing stage of the electronic device 101 through, for example, an experiment. The heat sensitive material or component inside the speaker 310 may vary according to the type of the electronic device 101 or the type of the speaker 310.

For example, if an adhesive member 501 (e.g., a bond) for joining components outside the speaker 500 has a property of deforming at a specific temperature, the temperature sensor 520 may be disposed around the adhesive member 501. By disposing the temperature sensor 520 near the heat sensitive material or component, the direct temperature of the heat sensitive portion may be measured. The temperature guaranteeing the quality of the speaker 500 may be determined based on the temperature obtained by the temperature sensor 520 disposed in the heat sensitive portion. The electronic device 101 may identify whether the temperature of the speaker 500 obtained through the temperature sensor 520 falls within the temperature range for guaranteeing the quality. Hence, the range of the temperature for guaranteeing the quality of the speaker 500 may be further widened. In addition, by determining the temperature of the speaker 500 using the temperature sensor 520 as well as the impedance measurement of the voice coil 530, the accurate temperature of the speaker 500 may be measured.

Figure 6:
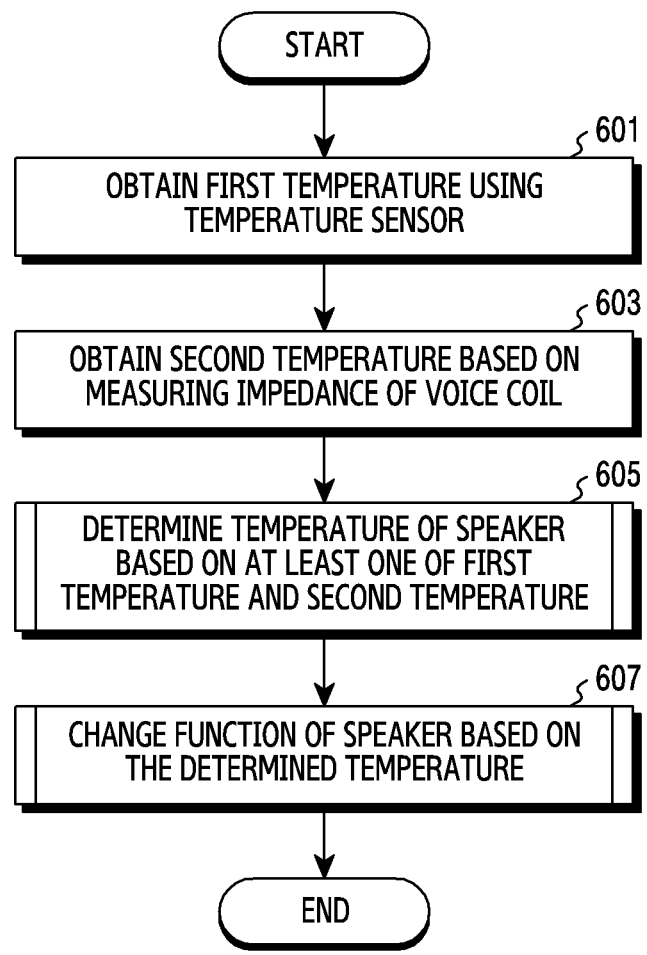
FIG. 6 illustrates an example of operations of an electronic device according to various embodiments.

FIG. 6 illustrates an example of operations of an electronic device according to various embodiments. Operations shown in FIG. 6 may be performed by the electronic device 101 of FIG. 3.

Referring to FIG. 6, in operation 601, the processor 120 may acquire data relating to the first temperature using the temperature sensor 320. The temperature sensor 320 (e.g., a thermistor) may be disposed (or attached) in at least some area inside the speaker 310. In some embodiments, the temperature sensor 320 may be disposed near a heating source (e.g., the voice coil 330) inside the speaker 310. In some other embodiments, the temperature sensor 320 may be disposed near the heat sensitive material or component inside the speaker 310. The processor 120 may acquire the data relating to the first temperature of the at least some area where the temperature sensor 320 is disposed, using the temperature sensor 320. For example, the processor 120 may obtain the data relating to the first temperature from the temperature sensor 320, based on identifying the output of the amplifier or the speaker 310. For example, the processor 120 may drive the temperature sensor 320, only while outputting the sound through the speaker 310.

In operation 603, the processor 120 may obtain data relating to the second temperature based on measuring the impedance of the voice coil 330. For example, the processor 120 may identify the second temperature corresponding to the impedance of the voice coil 330, based on the table stored in the memory 130. The second temperature may be a predicted temperature rather than the precise temperature of the speaker 310. For example, the measurement value of the impedance of the voice coil 330 may change even if the temperature does not change, due to a change of the contact point of the circuit.

For example, based on identifying the output of the amplifier or the speaker 310, the processor 120 may measure the impedance of the voice coil 330, and gather the data relating to the second temperature.

The order of operation 601 and operation 603 may be changed, and may be performed in parallel at the same time.

In operation 605, the processor 120 may determine a temperature of the speaker 310 based on at least one of the first temperature and the second temperature. For example, the processor 120 may determine one of the first temperature or the second temperature as the temperature of the speaker 310. In another example, the processor 120 may identify a weight of the first temperature and a weight of the second temperature for determining the temperature of the speaker 310. The processor 120 may identify the operation state of the electronic device 101, and identify the weight of the first temperature and the weight of the second temperature for determining the temperature of the speaker 310 according to the operation state of the electronic device 101. Detailed descriptions on the operation for determining the temperature of the speaker 310 based on at least one of the first temperature and the second temperature, will be described later with reference to FIG. 7.

In operation 607, the processor 120 may change a function of the electronic device 101 or the speaker 310, based on the determined temperature of the speaker 310. For example, the processor 120 may limit the function of the electronic device 101 to lower the temperature of the speaker 310, based on identifying that the temperature of the speaker 310 is greater than or equal to a designated temperature. Based on identifying that the temperature of the speaker 310 is greater than or equal to the designated temperature, the processor 120 may set the equalizer (e.g., the audio signal processor 240) to the low power mode, or lower the brightness of the display 350, set the processor 120 to the low power mode, or display a notification guiding to terminate an application not in use. For another example, the processor 120 may output different media art according to the temperature of the speaker 310, on the display 350. Detailed descriptions of the operation for changing the function of the electronic device 101 or the speaker 310m based on the temperature of the speaker 310 will be described later with reference to FIG. 8 through FIG. 9.

Figure 7:
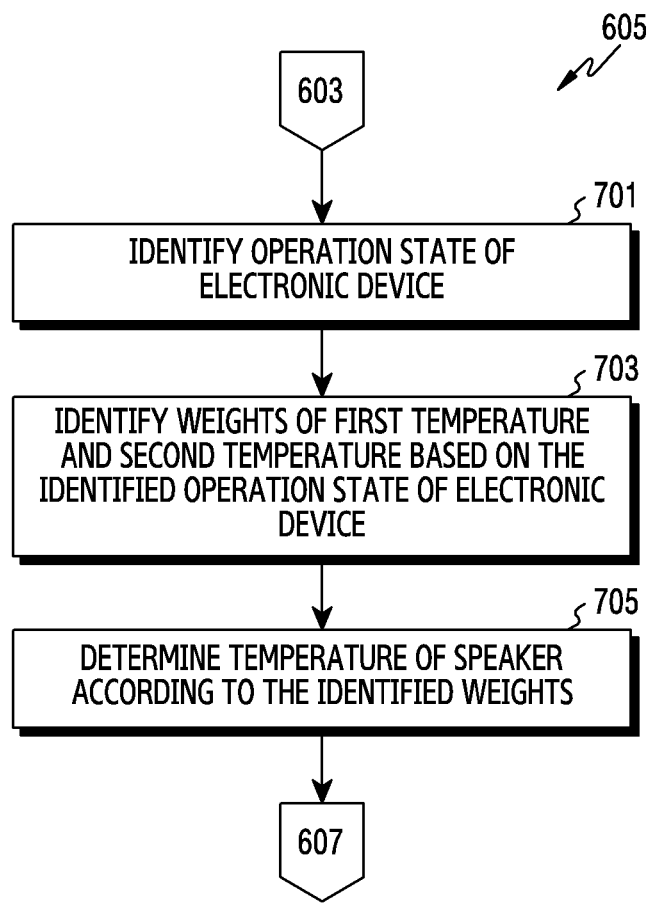
FIG. 7 illustrates an example of operations for determining a temperature of a speaker, in an electronic device according to various embodiments.

FIG. 7 illustrates an example of operations for determining a temperature of a speaker, in an electronic device according to various embodiments. The operations shown in FIG. 7 may be performed by the electronic device 101 of FIG. 3. The operations shown in FIG. 7 may correspond to operation 605 of FIG. 6.

Referring to FIG. 7, in operation 701, the processor 120 may identify the operation state of the electronic device 101. For example, the processor 120 may identify the operation state of the electronic device 101 based on obtaining the first temperature using the temperature sensor 320 in operation 601 of FIG. 6 and obtaining the second temperature based on measuring the impedance of the voice coil 330 in operation 603. Yet, it is not limited thereto. The order of operation 601, operation 603, and operation 701 may be changed, and may be performed in parallel at the same time.

For example, the processor 120 may identify the operation state of the electronic device 101, in response to identifying that the sound is output through the speaker 310. The operation state of the electronic device 101 while outputting the sound through the speaker 310 may include whether to output a screen (e.g., multimedia, an image, an application screen, etc.) through the display 350, whether the power consumption of the display 350 is higher than designated power, whether the power consumption of the processor 120 is higher than designated power, or whether the electronic device 101 is in the handset mode.

In operation 703, based on the identified operation state of the electronic device 101, the processor 120 may identify the weight of the first temperature and the weight of the second temperature for determining the temperature of the speaker 310. For example, the processor 120 may identify the weight of the first temperature and the weight of the second temperature according to the operation state of the electronic device 101, based on the table stored in the memory 130. The weight of the first temperature and the weight of the second temperature may vary depending on the type of the electronic device 101 and the operation state of the electronic device 101. For example, the weight of the first temperature and the weight of the second temperature according to the operation state of the electronic device 101 may be determined at the manufacturing phase of the electronic device 101.

In an operation state having considerable heat, an accurate temperature of the speaker 310 may be obtained by increasing the weight of the first temperature and decreasing the weight of the second temperature for determining the temperature of the speaker 310. Thus, deformation and damage of the component of the speaker 310 may be prevented.

For example, if outputting the screen (e.g., multimedia, an image, or an application screen, etc.) through the display 350 while outputting the sound through the speaker 310, the weight of the first temperature for determining the temperature of the speaker 310 may be increased. In another example, if a use time or a frequency of use of a component (e.g., a chip set) having heat generating characteristics exceeds a designated level, the weight of the first temperature for determining the temperature of the speaker 310 may be increased. As another example, if the power consumption of the display 350 is greater than or equal to the designated power, or if the power consumption of the processor 120 is greater than or equal to the designated power, the weight of the first temperature for determining the temperature of the speaker 310 may be increased. In another example, in the electronic device 101 in which a component (e.g., a chip set or a sensor) having the heat generating characteristics is disposed close to the speaker 310, the weight of the first temperature for determining the temperature of the speaker 310 may be increased. As another example, in the electronic device 101 using a display which consumes considerable power, the weight of the first temperature for determining the temperature of the speaker 310 may be increased.

In an operation state of less heat generation, a processing speed of the processor 120 and the current consumption of the temperature sensor 320 may be minimized, by lowering the weight of the first temperature and raising the weight of the second temperature for determining the temperature of the speaker 310. For example, if the heat generated by the speaker 310 is most of the heat generated by the electronic device 101, the driving of the temperature sensor 320 may be minimized, or the temperature sensor 320 may not be driven. Since there is little heat generation factor other than the speaker 310, even if the second temperature based on the impedance of the voice coil 330 is quite different from the temperature of the speaker 310, it may be used the temperature for guaranteeing the quality of the speaker 310.

For example, if the electronic device 101 is in the handset mode while outputting the sound through the speaker 310, the weight of the second temperature for determining the temperature of the speaker 310 may increase. The handset mode may indicate a state in which the electronic device 101 transmits and receives a signal for a phone call to and from another electronic device. For another example, if the power consumption of the display 350 is lower than the designated power, or the power consumption of the processor 120 is lower than the designated power, the weight of the second temperature for determining the temperature of the speaker 310 may be increased. As another example, as another example, in the electronic device 101 using a display having less power consumption, the weight of the second temperature for determining the temperature of the speaker 310 may be increased.

In operation 705, the processor 120 may determine the temperature of the speaker 310 according to the identified weight. For example, if the weight of the first temperature and the weight of the second temperature identified from the table stored in the memory 130 are 7:3, the processor 120 may determine the temperature of the speaker 310 by applying the first temperature and the second temperature at 7:3.

Based on determining the temperature of the speaker 310, the processor 120 may proceed to operation 607 of FIG. 6, and change the function of the electronic device 101 based on the determined temperature. Detailed descriptions on the operation for changing the function of the electronic device 101, based on the temperature of the speaker 310 will be described later with reference to FIG. 8 through FIG. 9.

Figure 8:
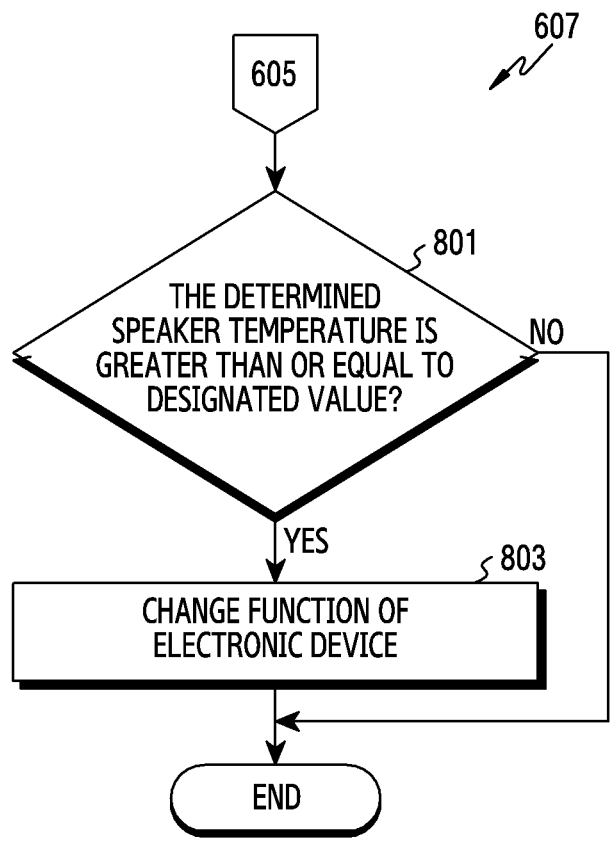
FIG. 8 illustrates an example of operations for changing a function of an electronic device based on a temperature of a speaker, in the electronic device according to various embodiments.

FIG. 8 illustrates an example of operations for changing a function of an electronic device based on a temperature of a speaker, in the electronic device according to various embodiments. The operations shown in FIG. 8 may be performed by the electronic device 101 of FIG. 3. The operations shown in FIG. 8 may correspond to operation 607 of FIG. 6.

Referring to FIG. 8, the processor 120 may identify whether the temperature of the speaker 310 is greater than or equal to a designated value in operation 801, based on determining the temperature of the speaker 310 in operation 605.

If identifying that the determined temperature of the speaker 310 falls below the designated temperature, there is no risk that the component of the speaker 310 is deformed or damaged, and accordingly the processor 120 may not change the function of the electronic device 101.

Based on identifying that the determined temperature of the speaker 310 is greater than or equal to the designated temperature, the processor 120 may change the function of the electronic device 101 in operation 803. For example, in response to identifying that the temperature of the speaker 310 is greater than or equal to the designated temperature, the processor 120 may limit the function of the electronic device 101 to lower the temperature of the speaker 310.

In some embodiments, based on identifying that the temperature of the speaker 310 is greater than or equal to the designated temperature, the processor 120 may reduce an input signal of the audio module 170 or the amplifier. For example, the processor 120 may transmit the reduced input signal to the audio module 170 or the amplifier, based on a gain table. By reducing the input signal, the heat generation of the speaker 310 may be alleviated, and the damage of the component of the speaker 310 due to the heat generation may be prevented.

In some other embodiments, based on identifying that the temperature of the speaker 310 is greater than or equal to the designated temperature, the processor 120 may set the equalizer (e.g., the audio signal processor 240) of the audio module 170 to the low power mode.

In some other embodiments, based on identifying that the temperature of the speaker 310 is greater than or equal to the designated temperature, the processor 120 may lower the brightness of the display 350 to designated brightness. For example, if identifying whether the display 350 is turned on while outputting sound through the speaker 310 and the display 350 is turned on, the processor 120 may lower the brightness of the display 350 to the designated brightness. The processor 120 may gradually change the brightness of the display 350 according to the temperature of the speaker 310. For example, the processor 120 may reduce the brightness of the display 350 by about 10% if the temperature of the speaker 310 is greater than or equal to about 100° C., reduce the brightness of the display 350 by about 5% if the temperature of the speaker 310 is greater than or equal to 80° C. or less than 100° C., and maintain the brightness of the display 350 if the temperature of the speaker 310 is less than 80° C.

In some other embodiments, the processor 120 may set the processor 120 to the low power mode, based on identifying that the temperature of the speaker 310 is greater than or equal to the designated temperature. For example, the processor 120 may identify whether the processor 120 is in the low power mode while outputting the sound through the speaker 310, and if the processor 120 is not in the low power mode, may reduce the power consumption of the processor 120.

In some other embodiments, the processor 120 may display a notification to guide the termination of an unused application, on the display 350, based on identifying that the temperature of the speaker 310 is greater than or equal to the designated temperature. By terminating the application not in use, the power consumption of the processor 120 may be reduced, and damage of the component of the speaker 310 due to the heat generation may be prevented.

In some other embodiments, based on identifying that the temperature of the speaker 310 is greater than or equal to the designated temperature, the processor 120 may change the screen of the display 350 to a monochrome mode or change a background of the screen to black. An organic light emitting diode (OLED) display, which consumes less current for displaying the black than the consumption current for displaying white, may mitigate the heat generation of the speaker 310.

By the various operations for changing the function of the electronic device 101 as described above, the heat generation of the speaker 310 may be alleviated, and the deformation of the component and the quality of the speaker 310 due to the heat generation may be prevented.

In some embodiments, based on identifying the temperature of the speaker 310, the processor 120 may change media art of the screen outputted on the display 350. The processor 120 may change a background color of a screen (e.g., a media art screen or an application screen) or a shape of an object displayed on the screen, according to the temperature of the speaker 310. For example, as a visual effect, the processor 120 may output the background color of the screen in red if the temperature of the speaker 310 is greater than equal to 90° C. or so, output the background color of the screen in yellow if the temperature of the speaker 310 is greater than or equal to about 80° C. and less than 90° C., and output the background color of the screen in blue if the temperature of the speaker 310 is less than 80° C. or so.

Figure 9:
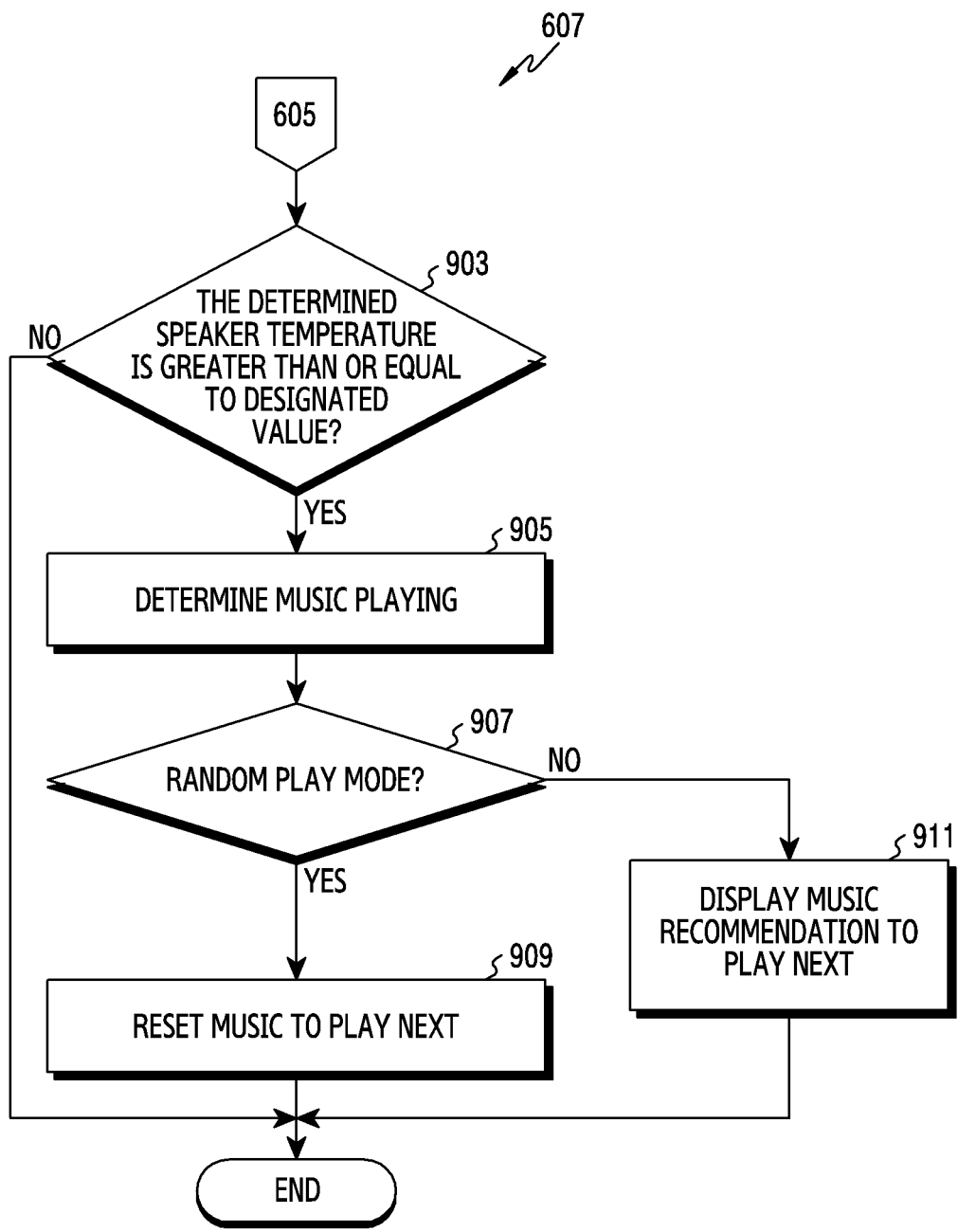
FIG. 9 illustrates another example of operations for changing a function of an electronic device based on a temperature of a speaker in the electronic device according to various embodiments.

FIG. 9 illustrates another example of operations for changing a function of an electronic device based on a temperature of a speaker in the electronic device according to various embodiments. FIG. 9 depicts, as another example of the operations for changing the function of the electronic device based on the temperature of the speaker, operations for changing music to play next based on the temperature of the speaker. The operations shown in FIG. 9 may be performed by the electronic device 101 of FIG. 3. The operations shown in FIG. 9 may correspond to operation 607 of FIG. 6.

Referring to FIG. 9, the processor 120 may identify whether the temperature of the speaker 310 is greater than or equal to a designated value in operation 903, based on determining the temperature of the speaker 310 in operation 605.

If identifying that the determined temperature of the speaker 310 is less than the designated temperature, there is no risk of deforming the quality of the speaker 310 due to heat generation, and accordingly the processor 120 may not change the function of the electronic device 101. That is, the processor 120 may not change the music to play next.

Based on identifying that the determined temperature of the speaker 310 is greater than or equal to the designated temperature, the processor 120 may identify that the electronic device 101 is playing music in operation 905.

In operation 907, the processor 120 may identify whether the electronic device 101 plays music in a random play mode (e.g., shuffle). The random play mode, which determines the music to play next by shuffling a plurality of music files, indicates a play mode in which the user may not know the music to play next.

In operation 909, based on identifying the random play mode, the processor 120 may reset (or change) the music to play next. For example, to mitigate the heat generated by the speaker 310, the processor 120 may identify music having low output power among the plurality of the music files included in a playlist, for the next playback. For example, based on identifying that the determined temperature of the speaker 310 is greater than or equal to 100° C. or so, the processor 120 may seamlessly change the next play music to classic or ballad.

Based on identifying no random play mode during the music playback, the processor 120 may display a notification for recommending music to play next, on the display 350, in operation 911. If not in the random play mode, a sequential play mode for sequentially playing a plurality of music files, or a selective play mode for playing a song designated by a user's selection may be indicated. Based on identifying that the music is not played in the random play mode and the temperature of the speaker 310 is greater than or equal to about 100° C., the processor 120 may identify low-output power music (e.g., classic, or ballad) among the plurality of the music files included in the playlist. The processor 120 may display a notification for recommending the identified music (e.g., classic or ballad) as the music to play next, on the display 350. The processor 120 may play the identified music (e.g., classic, or ballad) next, based on receiving a user input for the notification.

In operation 909 or operation 911 as described above, to identify the low-output power music, the processor 120 may identify, for example, music having a frequency within a designated frequency range, music having an intensity less than or equal to a designated intensity, or music in which a change of the frequency or the intensity is less than a designated size within a designated time interval. In another example, to identify the low-output power music, the processor 120 may identify genres of the plurality of the music files included in the playlist, and identify music of a designated genre as the low-output power music. The designated genre may include a genre which does not significantly increase the temperature of the speaker 310. The designated genre may include classic or ballad.

Based on the identification, the processor 120 may reset the low-output power music to the music to play next, in the random play mode. Based on the identification, the processor 120 may display a notification (e.g., a pop-up) for guiding the low-output power music as the music to play next, in the selective play mode (or the sequential play mode).

By the above-described operations, the heat generation of the speaker 310 may be alleviated, and the deformation of the component and the quality of the speaker 310 due to the heat generation may be prevented.

Figure 10:
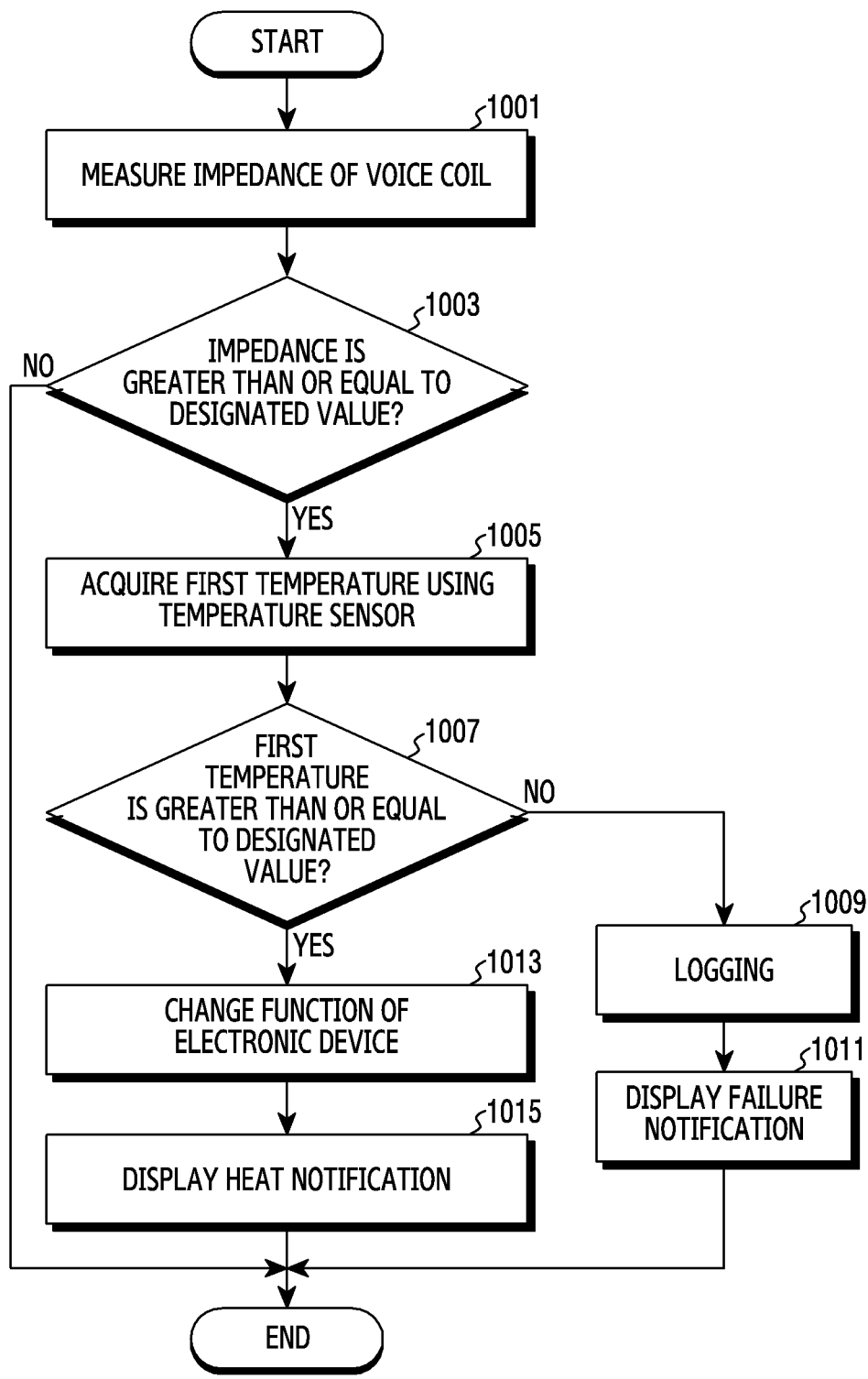
FIG. 10 illustrates an example of operations for identifying a failure of a speaker using a first temperature and a second temperature in an electronic device according to various embodiments.

FIG. 10 illustrates an example of operations for identifying a failure of a speaker using a first temperature and a second temperature in an electronic device according to various embodiments. The operations shown in FIG. 10 may be performed by the electronic device 101 of FIG. 3.

Referring to FIG. 10, in operation 1001, the processor 120 may measure the impedance of the voice coil 330 included in the speaker 310. For example, the processor 120 may receive a value indicating the impedance of the voice coil 330 from the speaker 310 or the audio module 170. In another example, the processor 120 may acquire the voltage and/or the current of the voice coil 330, and measure the impedance of the voice coil 330 based on the acquisition.

In operation 1003, the processor 120 may identify whether the impedance of the voice coil 330 is greater than or equal to a designated value. Operation 1001 and operation 1003 may be replaced with corresponding operations. For example, the processor 120 may measure the second temperature based on the impedance of the voice coil 330, and identify whether the second temperature is greater than or equal to a designated temperature.

In operation 1005, based on identifying that the impedance of the voice coil 330 is greater than or equal to the designated value, the processor 120 may acquire the first temperature using the temperature sensor 320 (e.g., the thermistor). Operation 1005 may correspond to operation 601 of FIG. 6.

In operation 1007, the processor 120 may identify whether the first temperature is greater than or equal to a designated value.

If the impedance is greater than or equal to the designated value (i.e., the second temperature is greater than or equal to the designated temperature) but the first temperature is less than the designated value, it may indicate a problem in the circuit inside the speaker 310. Accordingly, based on identifying that the first temperature is less than the designated value, the processor 120 may log the operation state of the electronic device 101 in operation 1009, and display a failure notification (e.g., an after service (AS) or customer service (CS) guide pop-up) in operation 1011.

If the impedance is greater than or equal to the designated value but the first temperature is less than the designated value, the impedance increase may be indicated even though the first temperature is not actual the heat generation. The increased impedance in spite of no actual heat generation may be, for example, an impedance sensing error or an incomplete contact of a part of the circuit connected to the voice coil 330 (e.g., contact with a printed circuit board (PCB)). Hence, the processor 120 may record and preserve the operation state of the electronic device 101 through logging, guide the possibility of failure through a pop-up, and guide the AS or the CS.

If the impedance is greater than or equal to the designated value (i.e., the second temperature is greater than or equal to the designated temperature) and the first temperature is greater than or equal to the designated value, which corresponds to the heat generation state, the processor 120 may change a function of the electronic device 101, in operation 1013. For example, based on identifying that the temperature of the speaker 310 is greater than or equal to the designated temperature, the processor 120 may limit the function of the electronic device 101 to lower the temperature of the speaker 310. Operation 1013 may correspond to operations 607 of FIG. 6 and FIG. 8. In operation 1015, the processor may display a notification indicating the heat generation, on the display 350.

Figure 11:
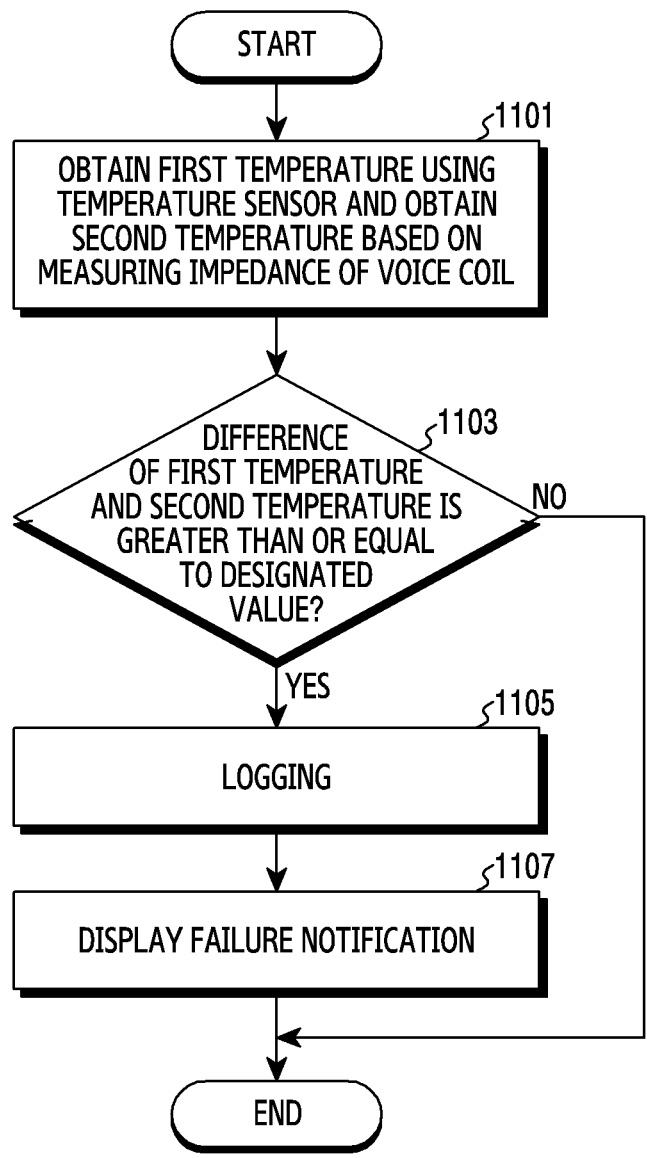
FIG. 11 illustrates another example of operations for identifying a failure of a speaker using a first temperature and a second temperature in an electronic device according to various embodiments.

FIG. 11 illustrates another example of operations for identifying a failure of a speaker using a first temperature and a second temperature in an electronic device according to various embodiments. Operations shown in FIG. 11 may be performed by the electronic device 101 of FIG. 3.

Referring to FIG. 11, in operation 1101, the processor 120 may obtain the first temperature using the temperature sensor 320, and obtain the second temperature based on measuring the impedance of the voice coil 330. Operation 1101 may correspond to operation 601 and operation 603 of FIG. 6.

In operation 1103, the processor 120 may identify whether a difference of the first temperature and the second temperature is greater than or equal to a designated value. If the difference of the first temperature and the second temperature is less than the designated value, the speaker 310 or the circuit for determining the temperature of the speaker 310 may be operating normally.

If the difference of the first temperature and the second temperature is greater than or equal to the designated value, a problem may occur in the speaker 310 or the circuit for determining the temperature of the speaker 310. For example, if the difference of the first temperature and the second temperature is greater than or equal to the designated value, an impedance sensing error or incomplete contact of a part of the circuit connected to the voice coil 330 (e.g., contact with a PCB) may occur.

Based on identifying that the difference of the first temperature and the second temperature is equal to or greater than the designated value, the processor 120 may log the operation state of the electronic device 101, in operation 1105. Operation 1105 may correspond to operation 1009 of FIG. 10.

In operation 1107, the processor 120 may display a failure notification (e.g., an AS or CS guide pop-up). The processor 120 may guide the possibility of the failure to the user through a pop-up. Operation 1107 may correspond to operation 1011 of FIG. 10.

An electronic device (e.g., the electronic device 101) according to various embodiments as explained above, may include a speaker (e.g., the sound output device 155, the speaker 310, the speaker 400, or the speaker 500), a temperature sensor (e.g., the temperature sensor 320, the temperature sensor 420, or the temperature sensor 520) disposed in at least some area inside the speaker, and at least one processor (e.g., the processor 120), wherein the at least one processor may be configured to obtain a first temperature of the at least some area using the temperature sensor, obtain a second temperature based on measuring impedance of a voice coil (e.g., the voice coil 330, the voice coil 430, or the voice coil 530) included in the speaker, determine a temperature of the speaker based on at least one of the first temperature and the second temperature, and based at least on the determined temperature of the speaker, change a function of the electronic device.

In various embodiments, the temperature sensor may include a thermistor, and the temperature sensor may be disposed at a center of the voice coil.

In various embodiments, the temperature sensor may be disposed near a component (e.g., the adhesive member 501) having characteristics which are deformed by heat, among components included in the speaker.

In various embodiments, the electronic device may further include a memory (e.g., the memory 130) for storing a weight of the first temperature and a weight of the second temperature corresponding to an operation state of the electronic device, wherein the at least one processor may be configured to identify the operation state of the electronic device, identify the weight of the first temperature and the weight of the second temperature corresponding to the operation state of the electronic device, and determine the temperature of the speaker based on the identified weight of the first temperature and the weight of the second temperature.

For example, the electronic device may further include a display (e.g., the display device 160, or the display 350), wherein the at least one processor may be configured to, based on identifying that power consumption of the display is greater than or equal to designated power, or power consumption of the at least one processor is greater than or equal to designated power, increase the weight of the first temperature for determining the temperature of the speaker.

For example, the at least one processor may be configured to, based on identifying that the electronic device transmits and receives a call signal to and from an external electronic device, increase the weight of the second temperature for determining the temperature of the speaker.

In various embodiments, the at least one processor may be configured to, as at least part of changing the function of the electronic device, perform at least one of decreasing a signal strength inputted to the speaker, decreasing brightness of a display of the electronic device, or decreasing power consumption of the at least one processor.

In various embodiments, the at least one processor may configured to, as at least part of changing the function of the electronic device, determine music to play next among a plurality of music in a playlist, based on identifying that the determined temperature of the speaker is greater than or equal to the designated temperature and the electronic device plays music. The music to play next may be determined based on at least one of music having output power less than or equal to a designated level, music having a frequency within a designated frequency range, music having an intensity less than or equal to a designated intensity, music having a change of the frequency or the intensity less than or equal to a designated intensity within a designated time interval, or music of a designated genre.

In various embodiments, the at least one processor may be configured to identify whether the impedance of the voice coil is greater than or equal to a designated value, based on identifying that the impedance of the voice coil is greater than or equal to the designated value, obtain the first temperature using the temperature sensor, and based on identifying that the first temperature is less than a designated temperature, log the operation state of the electronic device, or provide a notification related to a state of the electronic device.

In various embodiments, the at least one processor may be configured to, based on identifying that a difference of the first temperature and the second temperature is greater than or equal to a designated value, log the operation state of the electronic device, or provide a notification related to a state of the electronic device.

A method of an electronic device (e.g., the electronic device 101) according to various embodiments as explained above, may include obtaining a first temperature of the at least some area using a temperature sensor (e.g., the temperature sensor 320, the temperature sensor 420, or the temperature sensor 520) disposed in at least some area inside a speaker (e.g., the sound output device 155, the speaker 310, the speaker 400, or the speaker 500) of the electronic device, obtaining a second temperature based on measuring impedance of a voice coil (e.g., the voice coil 330, the voice coil 430, or the voice coil 530) included in the speaker, determining a temperature of the speaker based on at least one of the first temperature and the second temperature, and based at least on the determined temperature of the speaker, changing a function of the electronic device.

In various embodiments, the temperature sensor may include a thermistor, and the temperature sensor may be disposed at a center of the voice coil.

In various embodiments, the temperature sensor may be disposed near a component (e.g., the adhesive member 501) having characteristics which are deformed by heat, among components included in the speaker.

In various embodiments, determining the temperature of the speaker based on at least one of the first temperature and the second temperature may include identifying an operation state of the electronic device, determining a weight of the first temperature and a weight of the second temperature corresponding to the operation state of the electronic device, and determining the temperature of the speaker based on the weight of the first temperature and the weight of the second temperature.

In various embodiments, determining the weight of the first temperature and the weight of the second temperature may include, as at least part of the operation state, based on identifying that power consumption of the display (e.g., the display device 160, or the display 350) of the electronic device is greater than or equal to designated power, or power consumption of the at least one processor of the electronic device is greater than or equal to designated power, increasing the weight of the first temperature for determining the temperature of the speaker.

For example, determining the weight of the first temperature and the weight of the second temperature may include, as at least part of the operation state, based on identifying that the electronic device transmits and receives a call signal to and from an external electronic device, increasing the weight of the second temperature for determining the temperature of the speaker.

In various embodiments, changing the function of the electronic device according to the determined temperature of the speaker may include, based on identifying that the determined temperature of the speaker is greater than or equal to a designated temperature, decreasing a signal strength inputted to the speaker, decreasing brightness of a display (e.g., the display device 160, or the display 350) of the electronic device, or decreasing power consumption of at least one processor (e.g., the processor 120) of the electronic device.

In various embodiments, changing the function of the electronic device according to the determined temperature of the speaker may include determining music to play next among a plurality of music in a playlist, based on identifying that the determined temperature of the speaker is greater than or equal to the designated temperature and the electronic device plays music. The music to play next may be determined based on at least one of music having output power less than or equal to a designated level, music having a frequency within a designated frequency range, music having an intensity less than or equal to a designated intensity, music having a change of the frequency or the intensity less than or equal to a designated intensity within a designated time interval, or music of a designated genre.

In various embodiments, the method may include identifying whether the impedance of the voice coil is greater than or equal to a designated value, based on identifying that the impedance of the voice coil is greater than or equal to the designated value, obtaining the first temperature using the temperature sensor, and based on identifying that the first temperature is less than a designated temperature, logging the operation state of the electronic device, or providing a notification related to a state of the electronic device.

In various embodiments, the method may include, based on identifying that a difference of the first temperature and the second temperature is greater than or equal to a designated value, logging the operation state of the electronic device, or providing a notification related to a state of the electronic device.

Meanwhile, while the specific embodiment has been described in the explanations of the present disclosure, it will be noted that various changes may be made therein without departing from the scope of the present disclosure. Thus, the scope of the present disclosure is not limited and defined by the described embodiment and is defined not only the scope of the claims as below but also their equivalents.

The invention claimed is:

1. An electronic device comprising:
a speaker;
a temperature sensor disposed in at least some area inside the speaker; and
at least one processor,
wherein the at least one processor is configured to,
obtain a first temperature of the at least some area using the temperature sensor,
obtain a second temperature based on measuring impedance of a voice coil included in the speaker,
identify an operation state of the electronic device,
identify a weight of the first temperature and a weight of the second temperature corresponding to the operation state of the electronic device,
determine a temperature of the speaker based on the weight of the first temperature and the weight of the second temperature, and
based at least on the determined temperature of the speaker, change a function of the electronic device.

2. The electronic device of claim 1, wherein the temperature sensor comprises a thermistor, and
the temperature sensor is disposed at a center of the voice coil.

3. The electronic device of claim 1, wherein the temperature sensor is disposed near a component having characteristics which are deformed by heat, among components included in the speaker.

4. The electronic device of claim 1, further comprising:
a display,
wherein the at least one processor is configured to,
based on identifying that power consumption of the display is greater than or equal to designated power, or power consumption of the at least one processor is greater than or equal to designated power, increase the weight of the first temperature for determining the temperature of the speaker.

5. The electronic device of claim 1, wherein the at least one processor is configured to,
based on identifying that the electronic device transmits and receives a call signal to and from an external electronic device, increase the weight of the second temperature for determining the temperature of the speaker.

6. The electronic device of claim 1, wherein the at least one processor is configured to,
as at least part of changing the function of the electronic device, perform at least one of decreasing a signal strength inputted to the speaker, decreasing brightness of a display of the electronic device, or decreasing power consumption of the at least one processor.

7. The electronic device of claim 1, wherein the at least one processor is configured to,
as at least part of changing the function of the electronic device, determine music to play next among a plurality of music in a playlist, based on identifying that the determined temperature of the speaker is greater than or equal to a designated temperature and the electronic device plays music,
wherein the music to play next is determined based on at least one of music having output power less than or equal to a designated level, music having a frequency within a designated frequency range, music having an intensity less than or equal to a designated intensity, music having a change of the frequency or the intensity less than or equal to a designated intensity within a designated time interval, or music of a designated genre.

8. The electronic device of claim 1, wherein the at least one processor is configured to,
identify whether the impedance of the voice coil is greater than or equal to a designated value,
based on identifying that the impedance of the voice coil is greater than or equal to the designated value, obtain the first temperature using the temperature sensor, and
based on identifying that the first temperature is less than a designated temperature, log the operation state of the electronic device, or provide a notification related to a state of the electronic device.

9. The electronic device of claim 1, wherein the at least one processor is configured to,
based on identifying that a difference of the first temperature and the second temperature is greater than or equal to a designated value, log the operation state of the electronic device, or provide a notification related to a state of the electronic device.

10. A method of an electronic device, comprising:
obtaining a first temperature of at least some area using a temperature sensor disposed in at least some area inside a speaker of the electronic device;
obtaining a second temperature based on measuring impedance of a voice coil included in the speaker;
identifying an operation state of the electronic device;
determining a weight of the first temperature and a weight of the second temperature corresponding to the operation state of the electronic device; and
determining a temperature of the speaker based on the weight of the first temperature and the weight of the second temperature; and
based at least on the determined temperature of the speaker, changing a function of the electronic device.

11. The method of claim 10, wherein the temperature sensor comprises a thermistor, and
the temperature sensor is disposed at a center of the voice coil.

12. The method of claim 10, wherein the temperature sensor is disposed near a component having characteristics which are deformed by heat, among components included in the speaker.

13. The method of claim 10, wherein determining the weight of the first temperature and the weight of the second temperature comprises:
as at least part of the operation state, based on identifying that power consumption of a display of the electronic device is greater than or equal to designated power, or power consumption of at least one processor of the electronic device is greater than or equal to designated power, increasing the weight of the first temperature for determining the temperature of the speaker.

* * * * *